(12) United States Patent
Lee

(10) Patent No.: US 10,796,775 B2
(45) Date of Patent: *Oct. 6, 2020

(54) SEMICONDUCTOR DEVICE INCLUDING MEMORY CELLS STORING MULTI-BIT DATA AND OPERATING METHOD OF THE SEMICONDUCTOR DEVICE

(71) Applicant: SK hynix Inc., Icheon-si, Gyeonggi-do (KR)

(72) Inventor: Hee Youl Lee, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/601,240

(22) Filed: Oct. 14, 2019

(65) Prior Publication Data

US 2020/0043560 A1 Feb. 6, 2020

Related U.S. Application Data

(63) Continuation of application No. 16/058,677, filed on Aug. 8, 2018, now Pat. No. 10,482,982.

(30) Foreign Application Priority Data

Dec. 26, 2017 (KR) .................. 10-2017-0179690

(51) Int. Cl.
*G11C 16/34* (2006.01)
*G11C 11/56* (2006.01)
(Continued)

(52) U.S. Cl.
CPC ...... *G11C 16/3427* (2013.01); *G11C 11/5628* (2013.01); *G11C 11/5671* (2013.01);
(Continued)

(58) Field of Classification Search
CPC . G11C 16/3427; G11C 16/08; G11C 16/3459; G11C 16/24; G11C 11/5671;
(Continued)

(56) References Cited

U.S. PATENT DOCUMENTS 8,331,144 B2   12/2012   Yoo et al.
8,514,621 B2   8/2013    Choi et al.
(Continued)

FOREIGN PATENT DOCUMENTS

KR    1020130125426 A    11/2013

*Primary Examiner* — Gene N Auduong
(74) *Attorney, Agent, or Firm* — William Park & Associates Ltd.

(57) ABSTRACT

In a method for operating a semiconductor device, the method may include: sorting program states of a memory cell that stores multi-bit data into a plurality of groups; applying different bias voltages to bit lines corresponding to a selected group among the plurality of groups; applying a program voltage to a selected word line corresponding to the selected group; verifying whether each of selected memory cells corresponding to the selected word line is programmed to a respective target program state; applying an inhibition voltage to bit lines coupled to programmed memory cells; and selecting a next group to be programmed until the plurality of groups are programmed.

19 Claims, 7 Drawing Sheets

(51) Int. Cl.
*G11C 16/08* (2006.01)
*G11C 16/24* (2006.01)

(52) U.S. Cl.
CPC .............. *G11C 16/08* (2013.01); *G11C 16/24* (2013.01); *G11C 16/3459* (2013.01)

(58) Field of Classification Search
CPC ........ G11C 11/5628; G11C 2211/5622; G11C 2211/5621; G11C 11/40; G11C 7/22
See application file for complete search history.

(56) References Cited

U.S. PATENT DOCUMENTS 9,953,703 B2     4/2018   Hahn et al.
10,482,982 B2 *   11/2019   Lee ........................ G11C 16/08

\* cited by examiner

SEMICONDUCTOR DEVICE INCLUDING MEMORY CELLS STORING MULTI-BIT DATA AND OPERATING METHOD OF THE SEMICONDUCTOR DEVICE

CROSS-REFERENCE TO RELATED APPLICATION

The present application is a continuation application of U.S. patent application Ser. No. 16/058,677, filed on Aug. 8, 2018, and claims priority under 35 U.S.C. § 119(a) to Korean patent application number 10-2017-0179690 filed on Dec. 26, 2017, in the Korean Intellectual Property Office, the entire disclosure of which is incorporated herein by reference.

BACKGROUND

1. Technical Field

An aspect of the present disclosure generally relates to an electronic device, and more particularly, to a semiconductor device and an operating method of the semiconductor device.

2. Related Art

A semiconductor memory device is a storage device implemented using a semiconductor such as silicon (Si), germanium (Ge), gallium arsenide (GaAs), or indium phosphide (InP). The semiconductor memory device is generally classified into a volatile memory device and a nonvolatile memory device.

The volatile memory is a memory device which loses stored data when a power supply is cut off. Examples of the volatile memory include a static random access memory (SRAM), a dynamic RAM (DRAM), a synchronous DRAM (SDRAM), and the like. The nonvolatile memory is a memory device which retains stored data even when a power supply is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

According to an aspect of the present disclosure, a method for operating a semiconductor device may be provided, the method including: sorting program states of a memory cell that stores multi-bit data into a plurality of groups; applying different bias voltages to bit lines corresponding to a selected group among the plurality of groups; applying a program voltage to a selected word line corresponding to the selected group; verifying whether each of a plurality of selected memory cells corresponding to the selected word line is programmed to a respective target program state; applying an inhibition voltage to bit lines coupled to programmed memory cells; and selecting a next group to be programmed until the plurality of groups are programmed.

According to an aspect of the present disclosure, a method for operating a semiconductor device may be provided, the method including: receiving multi-bit data to be programmed in each of a plurality of memory cells; applying different bias voltages to bit lines corresponding to selected memory cells among the plurality of memory cells according to a logical value of the multi-bit data; applying a program voltage to a selected word line corresponding to the selected memory cells; and verifying whether each of the selected memory cells corresponding to the selected word line is programmed to a respective target program state.

According to an aspect of the present disclosure, a semiconductor device may be provided, the semiconductor device including: memory cells each configured to store multi-bit data; bit lines corresponding to the respective memory cells; word lines electrically coupled to gate electrodes of the memory cells; and a control logic configured to sort program states of a memory cell that store multi-bit data into a plurality of groups, control application of different bias voltages to bit lines corresponding to a selected group among the plurality of groups, control application of a program voltage to a selected word line corresponding to the selected group, and verify whether each of a plurality of selected memory cells corresponding to the selected word line is programmed to a respective target program state.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain examples of embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is a different disclosure.

Various embodiments may provide a semiconductor device having increased operating speed and improved reliability, and an operating method of the semiconductor memory device.

Figure 1:
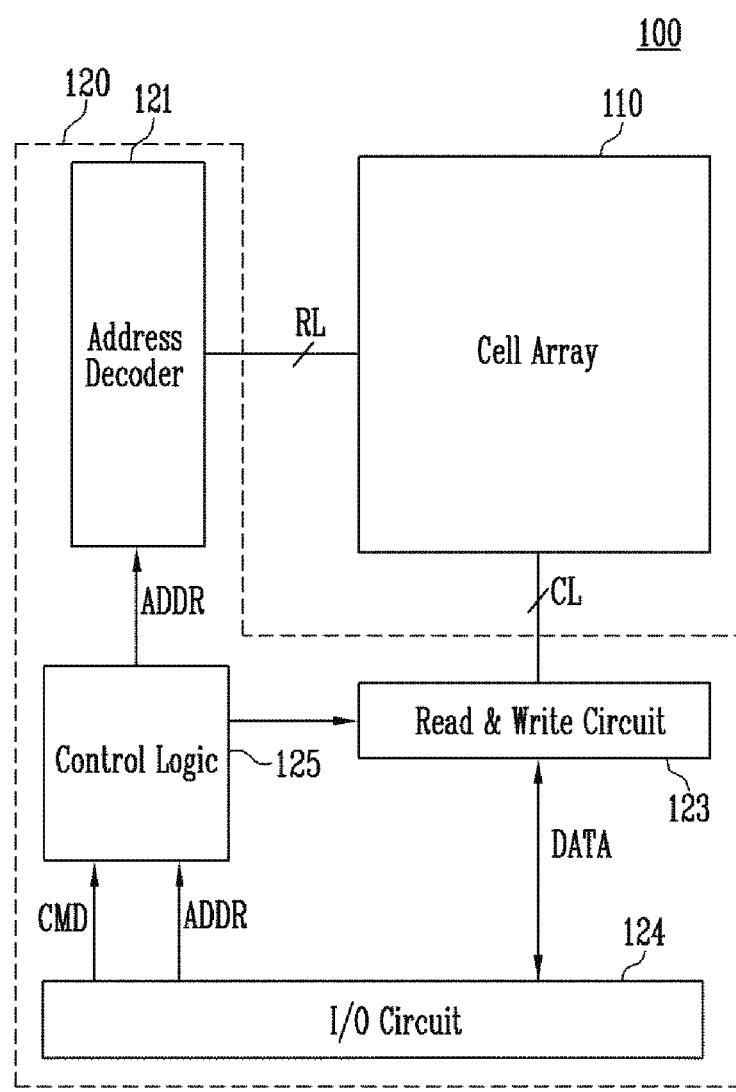
FIG. 1 is a block diagram illustrating a configuration of a semiconductor device according to an embodiment of the present disclosure.

FIG. 1 is a block diagram illustrating a configuration of a semiconductor device according to an embodiment of the present disclosure.

Referring to FIG. 1, the semiconductor device 100 may include a cell array 110 and a peripheral circuit 120.

The cell array 110 may be coupled to an address decoder 121 through row lines RL, and be coupled to a read & write circuit 123 through column lines CL. Here, the row lines RL may be word lines, and the column lines CL may be bit lines. In addition, the word lines and the bit lines are relative concepts. The row lines may be bit lines and the column lines may be word lines.

The cell array 110 may include a plurality of memory strings, and the memory strings may be arranged in a horizontal direction or vertical direction on a substrate. Also, the cell array 110 may include a plurality of memory blocks, and each of the memory blocks may include a plurality of pages. For example, the semiconductor device 100 may perform an erase operation in units of memory blocks, and perform a program operation or a read operation in units of pages.

The peripheral circuit 120 may include the address decoder 121, the read & write circuit 123, an input/output (I/O) circuit 124, and a control logic 125.

The control logic 125 may be coupled to the address decoder 121, the read & write circuit 123, and the I/O circuit 124. The control logic 125 may receive a command CMD and an address ADDR from the I/O circuit 124, and control the address decoder 121 and the read & write circuit 123 to perform an internal operation according to the received command CMD.

The address decoder 121 may be coupled to the cell array 110 through the row lines RL, and be configured to control the row lines RL under the control of the control logic 125. Therefore, the address decoder 121 may receive an address ADDR from the control logic 125, and select any one of the memory blocks of the cell array 110 according to the received address ADDR.

Program and read operations of the semiconductor device 100 may be performed in units of pages. Therefore, in the program and read operations, an address ADDR may include a block address and a row address. The address decoder 121 may decode a block address in the received address ADDR, and select one memory block according to the decoded block address. The address decoder 121 may decode a row address in the received address ADDR, and select any one page of the selected memory block according to the decoded row address.

An erase operation of the semiconductor device 100 may be performed in units of memory blocks. Therefore, in the erase operation, an address ADDR may include a block address. The address decoder 121 may decode a block address and select one memory block according to the decoded block address.

The read & write circuit 123 may be coupled to the memory cell array 110 through the column lines CL. In a program operation, the read & write circuit 123 may transfer data DATA received from the I/O circuit 124 to the column lines CL, and memory cells of a selected page may be programmed according to the transferred data DATA. Here, the data DATA may be multi-bit data to be programmed in each of the memory cells. In a read operation, the read & write circuit 123 may read data DATA from the memory cells of the selected page through the column line through the column lines CL, and output the read data DATA to the I/O circuit 124. In an erase operation, the read & write circuit 123 may allow the column lines CL to be floated. For reference, a verify operation may be included in the program operation and the erase operation. The verify operation may be performed in a similar manner to the read operation.

According to the configuration described above, the control logic 125 may control the semiconductor device 100 to program the memory cells in a multi-level cell (MLC) manner. Also, the control logic 125 may control the semiconductor device 100 to apply a program voltage to a selected word line while different bias voltages are applied to bit lines corresponding to selected memory cells.

For example, if multi-bit data to be programmed in each of memory cells is input from the I/O circuit 124 and the read & write circuit 123, the control logic 125 applies different bias voltages to the bit lines according to a logical value of the multi-bit data. The control logic 125 may control the address decoder 121 and the read & write circuit 123 to apply a program voltage to a selected word line and verify whether each of selected memory cells corresponding to the selected word line is programmed to a respective target program state. In addition, if the selected memory cells are programmed, the control logic 125 may control the semiconductor device 100 to apply an inhibition voltage to bit lines corresponding to the selected memory cells.

According to this control manner, a program voltage may be applied to a selected word line while different bias voltages are applied to the bit lines. Thus, each of the memory cells may be programmed to a plurality of program states, using one program operation, and program time may be reduced.

In addition, the control logic 125 may control the semiconductor device 100 to sort program states of a memory cell that stores multi-bit data into a plurality of groups, apply different bias voltages to bit lines corresponding to a selected group among the plurality of groups, apply a program voltage to a selected word line coupled to the selected group, and verify whether each of selected memory cells corresponding to the selected word line is programmed to a respective target program state. The control logic 125 may control the semiconductor device 100 to apply an inhibition voltage to the bit lines coupled to the programmed memory cells and select a next group to be programmed until programming is completed for the plurality of groups.

At this time, the control logic 125 may control the semiconductor device 100 to apply an inhibition voltage to bit lines corresponding to an unselected group among the plurality of groups. In this case, a program operation may be sequentially performed on the plurality of groups. Alternatively, the control logic 125 may control the semiconductor device 100 to apply a bias voltage even to bit lines corresponding to an unselected group among the plurality of groups. The bias voltage to apply to the bit lines corresponding to the unselected group may be the highest bias voltage among the bias voltages applied to the bit lines corresponding to the selected group. In this case, memory cells corresponding to the unselected group may be pre-programmed by the program operation of the selected group, and a main program operation may be performed on the pre-programmed memory cells by selecting the pre-programmed group. For example, when the pre-programmed group is selected, a program voltage may be applied to a selected word line while different bias voltages are applied to bit lines corresponding to the selected pre-programmed group so that a main program operation may be performed on the pre-programmed memory cells.

According to this control manner, the program operation may be performed in units of groups, program time may be reduced, and program disturbance may be prevented. Thus, the reliability of the semiconductor device 100 may be improved.

Figure 2:
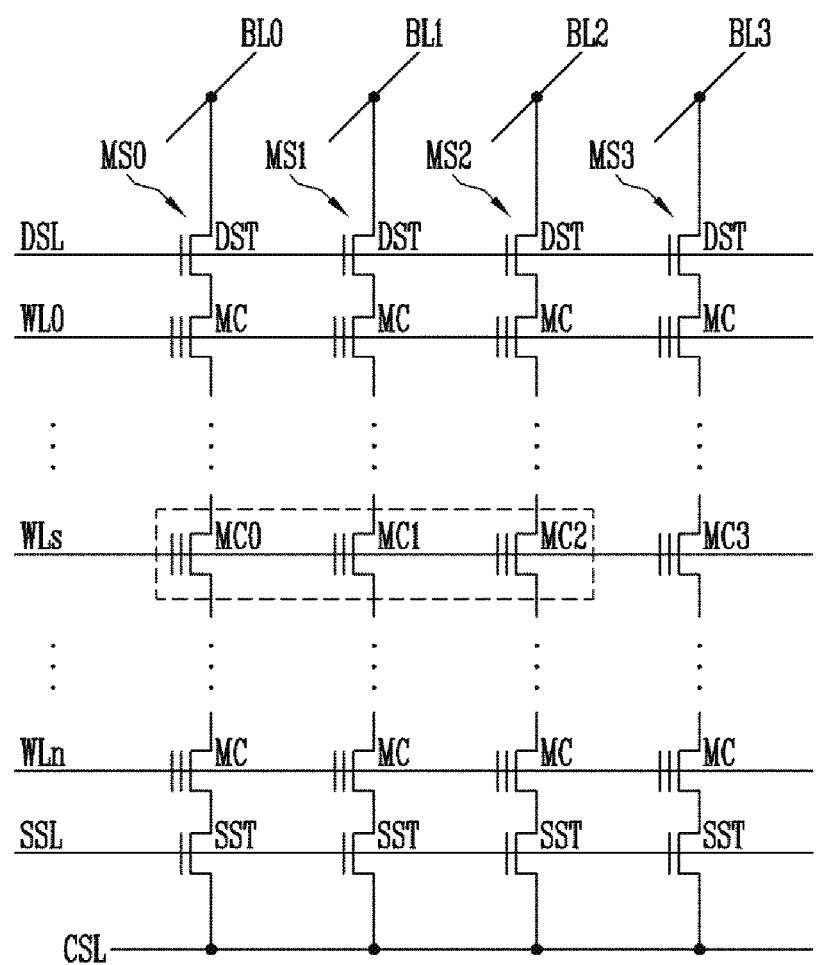
FIG. 2 is a circuit diagram illustrating a cell array structure of the semiconductor device according to an embodiment of the present disclosure.

FIG. 2 is a circuit diagram illustrating a cell array structure of the semiconductor device according to an embodiment of the present disclosure.

Referring to FIG. 2, a plurality of memory strings MS0 to MS3 may be coupled between bit lines BL0 to BL3 and a common source line CSL. Each of the memory strings MS0 to MS3 may include at least one drain select transistor DST, a plurality of memory cells MC, and at least one source select transistor SST, which are coupled in series. Although not shown in the drawing, each of the memory strings MS0 to MS3 may further include a pipe transistor coupled between the plurality of memory cells MC.

Here, each of the memory cells MC may include a channel layer, a gate electrode, and a data storage layer interposed between the channel layer and the gate electrode. For example, the data storage layer may include a floating gate, a charge trap material, polysilicon, a nitride, a variable resistance material, a phase change material, etc. In addition, a channel layer may have a pillar structure, and the gate electrode may have a gate all around (GAA) structure that surrounds the sidewall of the channel layer.

Also, each of the memory cells MC may be a multi-level memory cell that stores multi-bit data. For example, each of the memory cells MC may have a plurality of program states including an erase state, and be programmed in a multi-level cell (MLC) manner such as a triple-level cell (TLC) manner or a quadruple level cell (QLC) manner.

First to fourth memory strings MS0 to MS3 may be coupled to first to fourth bit lines BL0 to BL3, respectively. In addition, a drain select line DSL may control coupling between the first memory string MS0 and the first bit line BL0, coupling between the second memory string MS1 and the second bit line BL1, coupling between the third memory string MS2 and the third bit line BL2, and coupling between the fourth memory string MS3 and the fourth bit line BL3.

The first to fourth memory strings MS0 to MS3 may be commonly coupled to the common source line CSL. In addition, a source selection line SSL may control coupling between the first to fourth memory strings MS0 to MS3 and the common source line CSL.

First to (n+1)th word lines WL0 to WLn may be electrically coupled to the gate electrodes of the memory cells MC. In addition, the memory cells MC of the first to fourth memory strings MS0 to MS3 may share the first to (n+1)th word lines WL0 to WLn. For example, in a program operation, a program voltage may be applied to a selected word line WLs is transferred to gate electrodes of memory cells MC0 to MC3 of the first to fourth memory strings MS0 to MS3. In this case, selected memory cells MC0 to MC2 may be simultaneously programmed.

Figure 3:
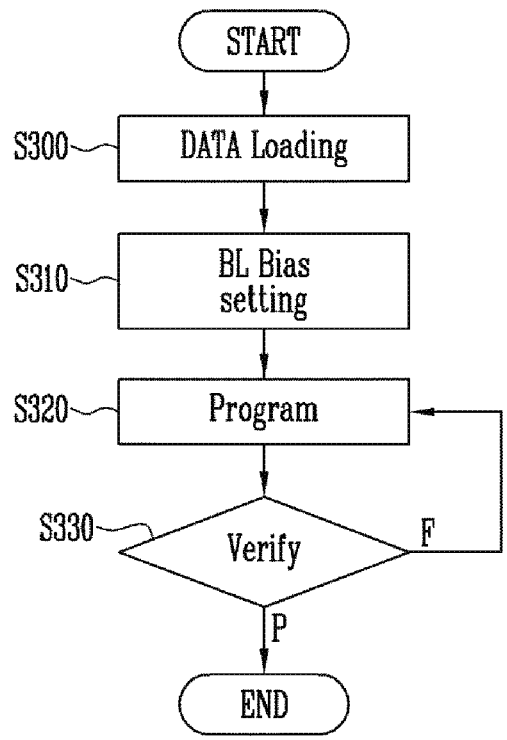
FIG. 3 is a flowchart illustrating an operating method of the semiconductor device according to an embodiment of the present disclosure.
Figure 4:
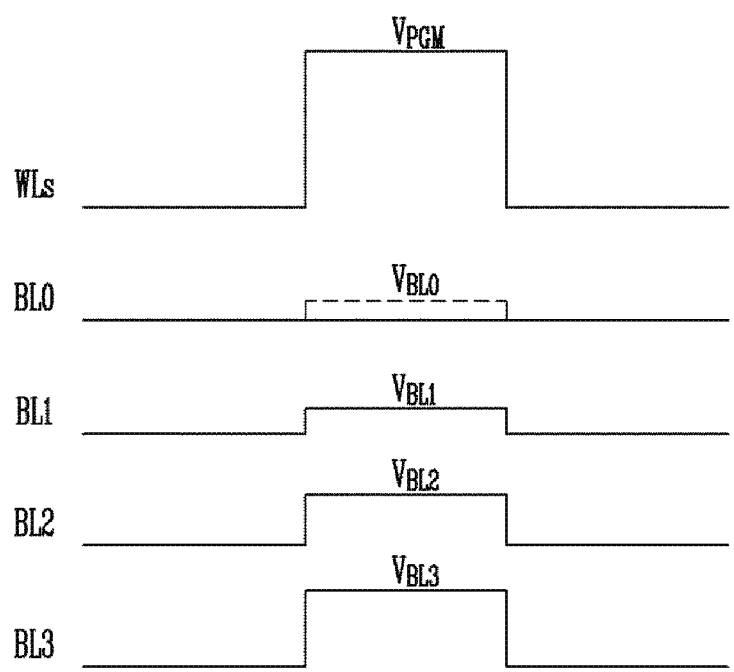
FIG. 4 illustrates voltages used in a program operation according to an embodiment of the present disclosure.
Figure 5:
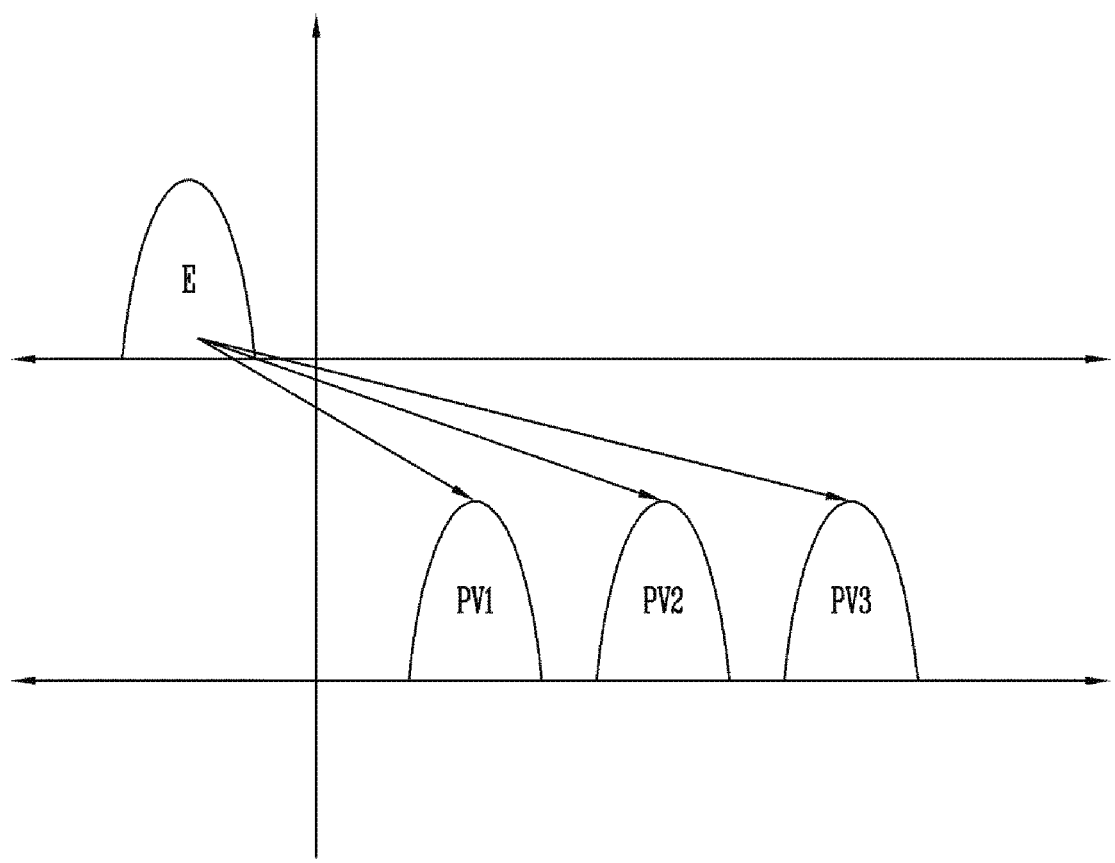
FIG. 5 illustrates a threshold voltage distribution of multi-level cells in the program operation according to an embodiment of the present disclosure.

FIG. 3 is a flowchart illustrating an operating method of the semiconductor device according to an embodiment of the present disclosure. FIG. 4 illustrates voltages used in a program operation according to an embodiment of the present disclosure. FIG. 5 illustrates a threshold voltage distribution of multi-level cells in the program operation according to an embodiment of the present disclosure. Hereinafter, a program operation of the semiconductor device having the cell array structure of FIG. 2 will be described by referring to FIGS. 3 to 5.

First, data to be programmed in each of the memory cells MC0 to MC3 may be input (DATA Loading, S300). Here, the data may be multi-bit data.

Subsequently, bias voltages of the bit lines BL0 to BL3 may be set (BL Bias setting, S310). Different bias voltages may be applied to bit lines BL0 to BL2 corresponding to the selected memory cells MC0 to MC2. Here, the bias voltages may be program permission voltages, and may be determined according to a logical value of the multi-bit data to be programmed in each of the memory cells MC0 to MC2.

For example, a first bias voltage $V_{BL0}$ may be applied to the first bit line BL0, a second bias voltage $V_{BL1}$ may be applied to the second bit line BL1, and a third bias voltage $V_{BL2}$ may be applied to the third bit line BL2. Here, the first to third bias voltages $V_{BL0}$ to $V_{BL2}$ may have a relationship of "$V_{BL0}<V_{BL1}<V_{BL2}$." For example, the first bias voltage VBL0 may be a ground voltage or have a level higher than that of the ground voltage, and the second bias voltage $V_{BL1}$ may have a level lower than that of a program voltage $V_{PGM}$. In addition, differences between the first to third bias voltages $V_{BL0}$ to $V_{BL2}$ may all be equal to or different from one another.

In addition, a fourth bias voltage $V_{BL3}$ may be applied to the fourth bit line BL3 corresponding to the unselected memory cell MC3. The fourth bias voltage $V_{BL3}$ may be a program inhibition voltage.

Subsequently, a program voltage may be applied to the selected word line WLs (Program, S320). At this time, since the program voltage is applied while different bias voltages are applied to the bit lines BL0 to BL2, voltage differences (e.g., $V_{PGM}-V_{BL0}$, $V_{PGM} V_{BL1}$, and $V_{PGM}-V_{BL2}$, etc.) applied between the channel layers and the gate electrodes in the respective memory cells MC0 to MC2 may be different from one another. Thus, the memory cells MC0 to MC2 may be programmed to different program states PV1 to PV3, using the same program voltage.

Subsequently, a verify operation may be performed (Verify, S330). For example, it may be verified whether each of the selected memory cells MC0 to MC2 is programmed to a respective target program state. If the verification fails (F), i.e., if each of the selected memory cells MC0 to MC2 are not programmed to a respective target program state, the program voltage may be re-applied. At this time, a program voltage having a level higher than that of a previously used program voltage may be used. For example, the program voltage may be applied using an incremental step pulse programming (ISPP) scheme, and the step of applying the program voltage and the step of performing the verify operation may be alternately repeated. If the verification passes (P), i.e., if each of the selected memory cells MC0 to MC2 are programmed to a respective target program state, an inhibition voltage may be applied to the bit lines BL0 to BL2 corresponding to the selected memory cells MC0 to MC2.

According to the operation described above, the memory cells MC0 to MC2 in an erase state E may be simultaneously programmed to different program states PV1 to PV3.

Figure 6:
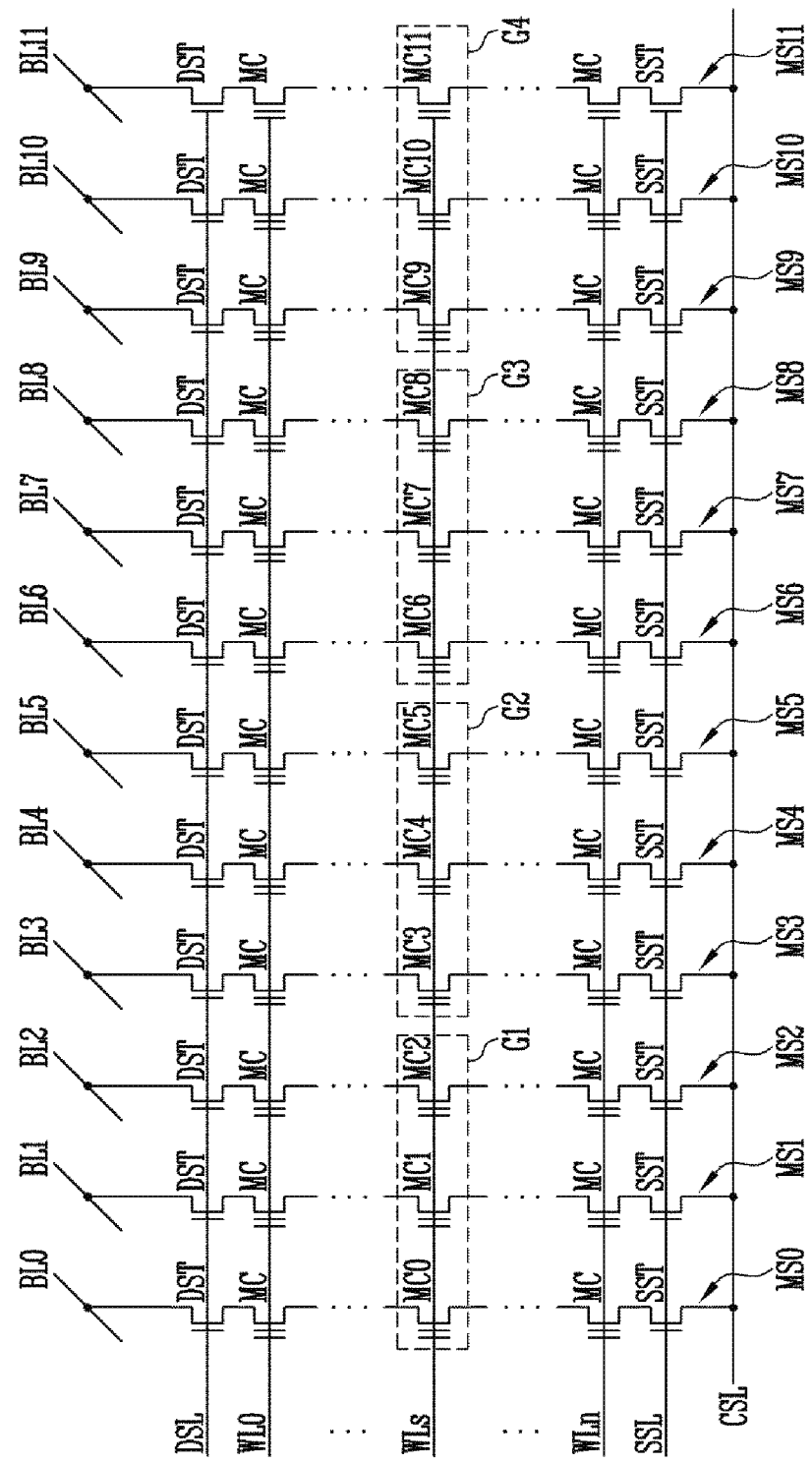
FIG. 6 is a circuit diagram illustrating a cell array structure of the semiconductor device according to an embodiment of the present disclosure.

FIG. 6 is a circuit diagram illustrating a cell array structure of the semiconductor device according to an embodiment of the present disclosure. Hereinafter, descriptions of contents overlapping with those described above will be omitted.

Referring to FIG. 6, a plurality of memory strings MS0 to MS11 are coupled between bit lines BL0 to BL11 and a common source line CSL. A drain select line DSL may control coupling between first to twelfth memory strings MS0 to MS11 and first to twelfth bit lines BL0 to BL11. A source select line SSL may control coupling between first to twelfth memory strings MS0 to MS11 and the common source line CSL.

Each of the memory strings MS0 to MS11 includes a plurality of memory cells MC, and each of the memory cells MC may be a multi-level memory cell that stores multi-bit data. In addition, program states of the memory cells MC may be sorted into a plurality of groups. Here, a program operation may be simultaneously performed on states belonging to one group. That is, the program operation is performed in units of pages, and memory cells belonging to the same group may be simultaneously selected and programmed. At this time, the number of groups and the number of states included in each group may be variously controlled. For example, each of the plurality of groups may include the same number of program states, or the numbers of states included in the respective groups may be different. In addition, only some of all program states may be grouped.

For example, when the memory cells MC are programmed in the QLC manner, each of the memory cells MC may have one state among an erase state E and first to fifteenth program states PV1 to PV15. Here, the first program state PV1 may have the lowest threshold voltage level, and the fifteenth program state PV15 may have the highest threshold voltage level. In other words, threshold voltage levels may be sequentially increased from the first program state PV1 to the fifteenth program state PV15.

In the QLC manner, the first to fifteenth program states PV1 to PV15 may be grouped into first to fifth groups G1 to G5. In this case, each group may include three states.

TABLE 1

| | G1 | G2 | G3 | G4 | G5 |
|---|---|---|---|---|---|
| E | PV1, PV2, PV3 | PV4, PV5, PV6 | PV7, PV8, PV9 | PV10, PV11, PV12 | PV13, PV14, PV15 |

Figure 7:
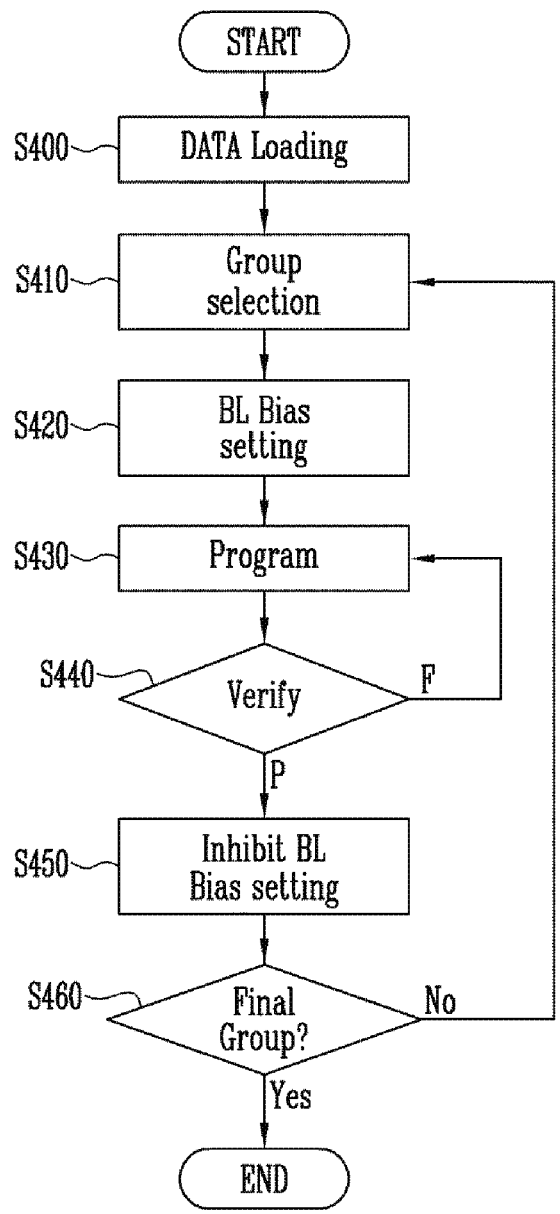
FIG. 7 is a flowchart illustrating an operating method of the semiconductor device according to an embodiment of the present disclosure.

FIG. 7 is a flowchart illustrating an operating method of the semiconductor device according to an embodiment of the present disclosure. Hereinafter, a program operation of the semiconductor device having the cell array structure of FIG. 6 will be described by referring to FIG. 7.

First, data to be programmed in each of the memory cells MC0 to MC11 may be input (DATA Loading, S400). Here, the data may be multi-bit data.

Subsequently, a group G1 to be programmed first among the plurality of groups G1 to G5 may be selected (Group selection, S410). As described with reference to Table 1, when the memory cells MC are programmed in the QLC manner and are grouped into the first to fifth groups G1 to G5, a group among the first to fifth groups G1 to G5 which is to be programmed first may be selected. Hereinafter, it is assumed that the first group G1 is selected first.

Subsequently, bias voltages of the bit lines BL0 to BL11 may be set (BL Bias setting, S420). At this time, bias voltages to be respectively applied to the bit lines BL0 to BL11 may be determined by checking to which group a program state according to data to be written in each of the memory cells MC0 to MC11 belongs. For example, a program permission voltage may be applied to bit lines corresponding to selected memory cells, and a program inhibition voltage may be applied to bit lines corresponding to unselected memory cells.

When the selected group G1 includes the first to third program states PV1 to PV3, memory cells MC0 to MC2 in which data corresponding to the first to third program states PV1 to PV3 is to be written may be selected. Then, different bias voltages may be applied to bit lines BL0 to BL2 corresponding to the selected memory cells MC0 to MC2. At this time, the program inhibition voltage may be applied to bit lines BL3 to BL11 corresponding to unselected memory cells MC3 to MC11.

Subsequently, a program voltage may be applied to a selected word line WLs (Program, S430). At this time, since the program voltage is applied while different bias voltages are applied to the bit lines BL0 to BL2, voltage differences (e.g., $V_{PGM}-V_{BL0}$, $V_{PGM}-V_{BL1}$, and $V_{PGM}-V_{BL2}$, etc.) applied between the channel layers and the gate electrodes in the respective memory cells MC0 to MC2 may be different from one another.

For example, the program voltage may be applied to the selected word line WLs while sequentially increased bias voltages ($V_{BL0}<V_{BL1}<V_{BL2}$) are applied to the first to third bit lines BL0 to BL2. In this case, the voltage applied between the channel layer and the gate electrode in the first memory cell MC0 may have the highest value, and the voltage applied between the channel layer and the gate electrode in the third memory cell MC2 may have the lowest value. Thus, the first to third memory cells MC0 to MC2 may be programmed to the third to first program states PV3 to PV1, respectively. Accordingly, the memory cells MC0 to MC2 may be programmed to different program states PV1 to PV3, using the same program voltage.

Subsequently, a verify operation may be performed (Verify, S440). For example, it may be verified whether the memory cells MC0 to MC2 belonging to the first group G1 are programmed to the third to first program states PV3 to PV1 (e.g., target program states), respectively. If the verification fails (F), i.e., if the selected memory cells MC0 to MC2 are not programmed to the respective target program states, the program voltage may be re-applied. At this time, a program voltage having a level higher than that of a previously used program voltage may be used. For example, the program voltage may be applied using the ISPP scheme, and the step of applying the program voltage and the step of performing the verify operation may be alternately repeated If the verification passes (P), i.e., if the selected memory cells MC0 to MC2 are programmed to the respective program states, an inhibition voltage may be applied to the corresponding bit lines BL0 to BL2 (Inhibit BL Bias setting, S450).

Subsequently, it may be checked whether the plurality of groups G1 to G5 are programmed (Final Group?, S460). If there exists any group G2 to G5 that is not programmed, a series of operations may be repeatedly performed from the step of selecting the group to be programmed (Group selection, S410). For example, the second group G2 may be selected, and different bias voltages may be applied to the bit lines BL3 to BL5. At this time, differences between the bias voltages applied to the bit lines BL3 to BL5 may be equal to those between the bias voltages applied to the bit lines BL0 to BL2 when the first group G1 was selected. In an embodiment, when the second group G2 is selected, a program voltage having a level higher than that of a previously used program voltage may be applied to the selected word line WLs while different bias voltages are applied to bit lines BL3 to BL5

Figure 8:
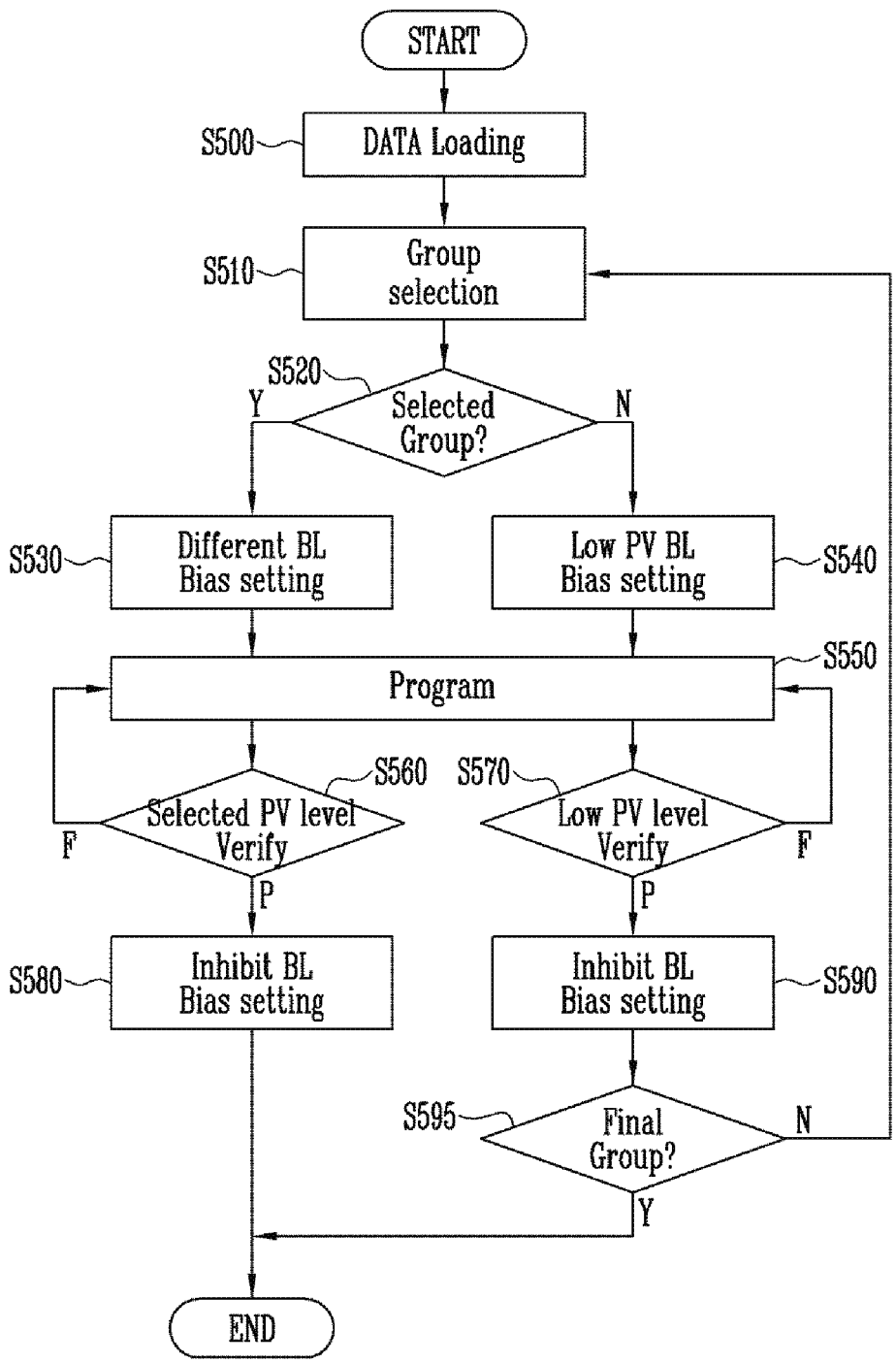
FIG. 8 is a flowchart illustrating an operating method of the semiconductor device according to an embodiment of the present disclosure.

FIG. 8 is a flowchart illustrating an operating method of the semiconductor device according to an embodiment of the present disclosure. Hereinafter, in a program operation of the semiconductor device having the cell array structure of FIG. 6, a method for pre-programming unselected groups when a selected group is programmed will be described.

First, data to be programmed in each of the memory cells MC0 to MC11 may be input (DATA Loading, S500). Subsequently, a group G1 to be programmed first among the plurality of groups G1 to G5 may be selected (Group selection, S510).

Subsequently, bias voltages of the bit lines BL0 to BL11 may be set. At this time, the bias voltages of the bit lines may be set in different manners according to the selected group or the unselected groups (Selected Group?, S520).

In the case of the selected group G1, different bias voltages may be applied to the bit lines BL0 to BL2 (Different BL Bias setting, S530). For example, sequentially increased bias voltages ($V_{BL0} < V_{BL1} < V_{BL2}$) may be applied to the first to third bit lines BL0 to BL2.

In the case of the unselected groups G2 to G5, a program permission voltage may be applied to the bit lines BL3 to BL11 (Low PV BL Bias setting, S540). In this case, a bias voltage for a pre-program may be applied to the bit lines BL3 to BL11. At this time, one of the bias voltages applied to the selected bit lines BL0 to BL2 may be selected and applied to the bit lines BL3 to BL11. For example, a program state PV1 having the lowest threshold voltage among the program states PV1 to PV3 belonging to the selected group G1 may be selected, and a bias voltage corresponding to the corresponding program state PV1 may be applied to the unselected bit lines BL3 to BL11. In this case, a bias voltage $V_{BL2}$ corresponding to the first program level PV1 may be applied to the unselected bit lines BL3 to BL11. That is, the highest bias voltage among the bias voltages applied to the bit lines BL0 to BL2 of the selected group G1 may be selected and applied to the unselected bit lines BL3 to BL11.

For reference, the pre-program may be performed on only some groups among the unselected groups G2 to G5. For example, except for the selected group G1 and an adjacent group G2, the pre-program may be performed on only the other unselected groups G3 to G5. In this case, a program inhibition voltage may be applied to bit lines BL3 to BL5 corresponding to the second group G2, and the bias voltage $V_{BL2}$ may be applied to only bit lines BL6 to BL11 corresponding to the other groups G3 to G5.

Subsequently, a program voltage may be applied to the selected word line WLs (Program, S550). At this time, the program voltage may be simultaneously applied to the selected group G1 and the unselected groups G2 to G5. Thus, while the memory cells MC0 to MC2 of the selected group G1 are being programmed, the memory cells MC3 to MC11 of the unselected groups G2 to G5 may be pre-programmed.

Subsequently, a verify operation may be performed. At this time, the verify operation may be performed based on different references according to the selected group or the unselected groups.

In the case of the selected group G1, the verification operation may be performed on each of the program states PV1 to PV3 belonging to the corresponding group G1 (Selected PV level Verify, S560). If the verification fails, the program voltage may be re-applied. At this time, a program voltage having a level higher than that of a previously used program voltage may be used. For example, the program voltage may be applied using the ISPP scheme, and the step of applying the program voltage and the step of performing the verify operation may be alternately repeated. In addition, if the verification of the memory cells MC0 to MC2 passes, an inhibition voltage may be applied to the corresponding bit lines BL0 to BL2 (Inhibit BL Bias setting, S580). Accordingly, the memory cells MC0 to MC2 may be programmed to desired program states PV1 to PV3.

In the case of the unselected groups G2 to G5, the verify operation may be performed by determining a verify level according to a pre-program level (Low PV level Verify, S570). As described above, if bias voltages of the bit lines BL3 to BL11 are set by selecting the first program state PV1, the verify operation may be performed using a verify level of the first program state PV1. For example, in an embodiment, the pre-programmed memory cells of the unselected groups G2 to G5 may be verified using a verify voltage of a program state having the lowest level among the program states, such as the first program state PV1 mentioned in the preceding case, belonging to the selected group.

If the verification fails, the program voltage having an increased level may be re-applied. In addition, if the verification of the memory cells MC3 to MC11 passes, a program inhibition voltage may be applied to the corresponding bit lines BL3 to BL11 (Inhibit BL Bias setting, S590). Accordingly, the second to fifth groups G2 to G5 may be pre-programmed to the first program state PV1.

For reference, the verify operation (Low PV level Verify, S570) on the unselected groups G2 to G5 may be omitted. Alternatively, the verify operation (Low PV level Verify, S570) may be performed on only some groups among the unselected groups G2 to G5. For example, except for the selected group G1 and an adjacent group G2, the verify operation (Low PV level Verify, S570) may be performed on only the other unselected groups G3 to G5.

Subsequently, it may be checked whether the plurality of groups G1 to G5 are programmed (Final Group?, S595). If there exists any group G2 to G5 that is not programmed, a series of operations may be repeatedly performed from the step of selecting the group to be programmed (Group selection, S510). For example, one group G2 among the pre-programmed groups G2 to G5 may be selected, and the pre-program may be re-performed on the other groups G3 to G5 while a main program operation is being performed on the pre-programmed group G2.

According to the present disclosure, program disturbance may be prevented, and program speed may be improved.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for operating a semiconductor device, the method comprising:
    sorting program states of a memory cell that stores multi-bit data into a plurality of groups;
    applying different bias voltages to selected bit lines corresponding to a selected group among the plurality of groups;
    applying a bias voltage among the different bias voltages to unselected bit lines corresponding to an unselected group among the groups;
    applying a first program voltage to a selected word line corresponding to the selected group; and
    verifying whether each of selected memory cells corresponding to the selected word line is programmed to a respective target program state.

2. The method of claim 1, wherein memory cells corresponding to the unselected group are pre-programmed by the first program voltage.

3. The method of claim 2, wherein pre-programmed memory cells are verified using a verify voltage of a program state having a least level among program states belonging to the selected group.

4. The method of claim 1, wherein the bias voltage is the greatest among the different bias voltages.

5. The method of claim 1, further comprising:
    selecting the unselected group after the selected memory cells are programmed;
    applying different bias voltages to the unselected bit lines; and
    applying a second program voltage to the selected word line,
    wherein memory cells corresponding to the unselected group are pre-programmed by the first program voltage and pre-programmed memory cells are main-programmed by the second program voltage.

6. The method of claim 5, wherein the second program voltage is greater than the first program voltage.

7. The method of claim 1, further comprising:
    applying a program inhibition voltage to unselected bit lines corresponding to an adjacent group among the groups, wherein the adjacent group is adjacent to the selected group.

8. The method of claim 1, further comprising:
    applying an inhibition voltage to bit lines coupled to programmed memory cells; and
    selecting a next group to be programmed until the plurality of groups are programmed.

9. A method for operating a semiconductor device, the method comprising:
    receiving multi-bit data to be programmed in each of memory cells;
    applying different bias voltages to selected bit lines corresponding to selected memory cells among the memory cells according to a logical value of the multi-bit data;
    applying a first program voltage to a selected word line corresponding to the selected memory cells; and
    verifying whether each of the selected memory cells corresponding to the selected word line is programmed to a respective target program state.

10. The method of claim 9, further comprising:
    applying a bias voltage among the different bias voltages to unselected bit lines corresponding to unselected memory cells among the memory cells.

11. The method of claim 10, wherein the bias voltage is the greatest among the different bias voltages.

12. The method of claim 10, further comprising:
    applying different bias voltages to the unselected bit lines after the selected memory cells are programmed; and
    applying a second program voltage to the selected word line,
    wherein the unselected memory cells are pre-programmed by the first program voltage and pre-programmed memory cells are main-programmed by the second program voltage.

13. The method of claim 12, wherein the second program voltage is greater than the first program voltage.

14. The method of claim 9, further comprising:
    applying a program inhibition voltage to adjacent bit lines, wherein the adjacent bit lines are adjacent to the selected bit lines.

15. A semiconductor device comprising:
    memory cells each configured to store multi-bit data;
    bit lines corresponding to the memory cells, respectively;
    word lines electrically coupled to gate electrodes of the memory cells; and
    a control logic configured to receive multi-bit data to be programmed in each of memory cells, control application of different bias voltages to selected bit lines corresponding to selected memory cells among the memory cells according to a logical value of the multi-bit data, control application of a first program voltage to a selected word line corresponding to the selected memory cells, and verify whether each of the selected memory cells corresponding to the selected word line is programmed to a respective target program state.

16. The semiconductor device of claim 15, wherein the control logic is configured to control application a bias voltage among the different bias voltages to unselected bit lines corresponding to unselected memory cells among the memory cells.

17. The semiconductor device of claim 16, wherein the bias voltage is the greatest among the different bias voltages.

18. The semiconductor device of claim 16, wherein the control logic is configured to control application different bias voltages to the unselected bit lines after the selected memory cells are programmed, and control application a second program voltage to the selected word line,
    wherein the unselected memory cells are pre-programmed by the first program voltage and pre-programmed memory cells are main-programmed by the second program voltage.

19. The semiconductor device of claim 18, wherein the second program voltage is greater than the first program voltage.

* * * * *